United States Patent
Smith et al.

(10) Patent No.: US 6,294,472 B1
(45) Date of Patent: Sep. 25, 2001

(54) DUAL SLURRY PARTICLE SIZES FOR REDUCING MICROSCRATCHING OF WAFERS

(75) Inventors: Jonathan B. Smith, Fremont, CA (US); Paul R. Besser; Jeremy I. Martin, both of Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/576,750

(22) Filed: May 23, 2000

(51) Int. Cl.$^7$ ................................................. H01L 21/00
(52) U.S. Cl. ...................... 438/693; 156/345; 216/89; 216/93; 438/745
(58) Field of Search ............................... 438/691, 692, 438/693, 745; 216/38, 88, 89, 91, 93; 156/345 LP, 345 L; 451/36, 41; 106/3

(56) References Cited

U.S. PATENT DOCUMENTS

| | | | |
|---|---|---|---|
| 5,571,373 | * | 11/1996 | Krishna et al. ................... 216/89 X |
| 6,106,728 | * | 8/2000 | Iida et al. ......................... 438/692 X |
| 6,123,603 | * | 9/2000 | Tada et al. ....................... 438/692 X |

* cited by examiner

*Primary Examiner*—William A. Powell
(74) *Attorney, Agent, or Firm*—Williams, Morgan & Amerson, P.C.

(57) ABSTRACT

A method includes providing at least one wafer having a process layer formed thereon for polishing. The process layer is polished using a first polishing process that is associated with a slurry having a first abrasive particle size. The process layer is polished using a second polishing process that is associated with a slurry having a second abrasive particle size that is different from the first abrasive particle size. A system includes a polishing tool and a process controller. The polishing tool is adapted to receive at least one wafer having a process layer formed thereon for polishing. The polishing tool is adapted to polish the process layer using a first polishing process that is associated with a slurry having a first abrasive particle size. The polishing tool is adapted to polish the process layer using a second polishing process that is associated with a slurry having a second abrasive particle size that is different from the first abrasive particle size. The process controller is coupled to the polishing tool and adapted to communicate with at least one of a slurry controller and the polishing tool.

59 Claims, 8 Drawing Sheets

DUAL SLURRY PARTICLE SIZES FOR REDUCING MICROSCRATCHING OF WAFERS

BACKGROUND OF THE INVENTION

1. Field of the Invention

This invention relates generally to semiconductor processing, and more particularly, to chemical mechanical polishing (CMP) using dual slurry particle sizes for reducing microscratching of wafers.

2. Description of the Related Art

CMP is a widely used means of planarizing silicon dioxide as well as other types of processing layers on semiconductor wafers. Chemical mechanical polishing typically utilizes an abrasive slurry disbursed in an alkaline or acidic solution to planarize the surface of the wafer through a combination of mechanical and chemical action. Generally, a chemical mechanical polishing tool includes a polishing device positioned above a rotatable circular platen or table on which a polishing pad is mounted. The polishing device may include one or more rotating carrier heads to which wafers may be secured, typically through the use of vacuum pressure. In use, the platen may be rotated and an abrasive slurry may be disbursed onto the polishing pad. Once the slurry has been applied to the polishing pad, a downward force may be applied to each rotating carrier head to press the attached wafer against the polishing pad. As the wafer is pressed against the polishing pad, a surface of a process layer formed above the wafer is mechanically and chemically polished.

As semiconductor devices are scaled down, the importance of chemical mechanical polishing to the fabrication process increases. In particular, it becomes increasingly important to minimize surface damage, such as microscratching, to either a post-polish surface of a process layer or the wafer. For example, in one embodiment, during a CMP process, abrasive particles within the slurry may be used to mechanically abrade a polishing surface of a process layer that has been formed above the wafer. As the wafer is polished, the interaction between the polishing surface and the abrasive particles may produce undesirable surface damage (e.g., microscratches) to the post-polish surface of the process layer.

In one illustrative embodiment, an oxide layer of a wafer may be planarized using a conventional CMP process (i.e., the surface of the oxide layer may be polished to produce a more uniform layer of material.) During this process, the interaction between the abrasive particles within the slurry and the surface of the oxide layer may produce small undesirable microscratches in the polished surface of the oxide layer. For example, depending upon the processing parameters of the polishing process (e.g., polishing time, slurry composition, carrier arm down force, etc.), the polishing process may produce microscratches in the polished surface of the oxide layer that are several microns long and have a depth of approximately 0.5 $\mu$m. If not removed, the microscratches may "trap" portions of additional processing layers within the oxide layer during subsequent processing steps.

For example, once the polishing of the oxide layer is complete, depending upon the particular process, additional process layers may be formed on the polished surface of the oxide layer. With one exemplary process, a conductive layer of material, such as metal, may be deposited on the polished surface of the oxide layer. As with conventional processing, the metal processing layer may be patterned, etched, and/or polished to produce at least a portion of a desired integrated circuit feature or configuration. For example, a blanket metal layer comprised of tungsten or copper may be formed above openings in the oxide layer and then subsequently polished to form electrical paths (e.g., interconnects) between stacked processing layers. Unfortunately, if microscratches are present in the polished surface of the oxide layer, portions of the metal processing layer may become "trapped" within the oxide layer, which may result in poor performance of the finished semiconductor device. For example, the "trapped" portion of the metal layer may produce a short circuit condition within the finished device or, in a less extreme case, undesirably high electrical leakage between adjacent metal lines.

One conventional method for alleviating polishing induced damage to the surface of a wafer or a processing layer is post-polish buffing. For example, once the CMP process is complete, the polishing surface of the wafer or the processing layer may be processed through a "buff" step, which may at least partially reduce the severity of any surface damage. In one embodiment, the "buff" step comprises positioning the polished surface of a process layer against a rotating buffing pad that has been mounted to a secondary platen. The wafer may then be rotated and pressed against the buffing pad for a predetermined amount of time.

The existing methods for alleviating surface damage present on the post-polish surface of a wafer or processing layer, however, suffer from several shortcomings. For example, with existing techniques, significant surface damage, such as deep microscratches, may not be completely removed. When this occurs, depending upon the application, the residual damage remaining on the polishing surface of the wafer or the processing layer may contribute to impaired final device performance. Additionally, conventional methods for alleviating polishing induced surface damage may decrease wafer throughput, thus, increasing the cost of the manufacturing process.

The present invention is directed to overcoming, or at least reducing the effects of, one or more of the problems set forth above.

SUMMARY OF THE INVENTION

In one aspect of the present invention, a method is provided. The method includes providing at least one wafer having a process layer formed thereon for polishing. The process layer is polished using a first polishing process that is associated with a slurry having a first abrasive particle size. The process layer is polished using a second polishing process that is associated with a slurry having a second abrasive particle size that is different from the first abrasive particle size.

In another aspect of the present invention, a system is provided. The system includes a polishing tool and a process controller. The polishing tool is adapted to receive at least one wafer having a process layer formed thereon for polishing. The polishing tool is adapted to polish the process layer using a first polishing process that is associated with a slurry having a first abrasive particle size. The polishing tool is adapted to polish the process layer using a second polishing process that is associated with a slurry having a second abrasive particle size that is different from the first abrasive particle size. The process controller is coupled to the polishing tool and adapted to communicate with at least one of a slurry controller and the polishing tool.

BRIEF DESCRIPTION OF THE DRAWINGS

The invention may be best understood by reference to the following description taken in conjunction with the accompanying drawings, in which like reference numerals identify like elements, and in which.

Figure 1:
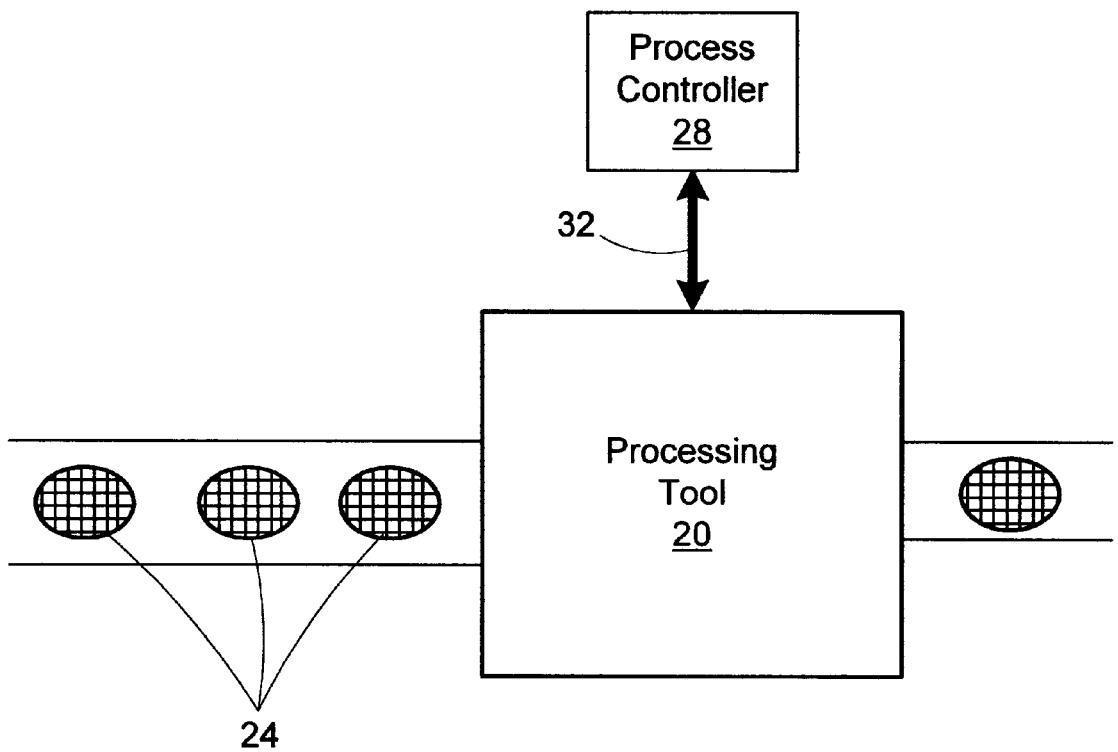
FIG. 1 is a simplified block diagram of a processing tool used to manufacture semiconductor devices.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention is directed to a CMP process that uses at least dual slurry particle sizes for reducing microscratching of wafers. In disclosing the present invention, reference will be made to the illustrative embodiment of the invention depicted in FIGS. 1–7. The relative sizes of the various features depicted in the drawings may be exaggerated or reduced as compared to the size of those feature sizes on actual devices. Nevertheless, the attached drawings are included to aid in obtaining an understanding of the present invention.

Referring to FIG. 1, an exemplary processing tool 20 is shown. The processing tool 20 may be used as one part of a fabrication process to manufacture semiconductor wafers 24 into functional semiconductor devices. The processing tool 20 may be controlled by a process controller 28 that may send a plurality of control signals to the processing tool on a control line 32. The process controller 28 may be comprised of a variety of devices. For example, in one embodiment, the process controller 28 may be a controller embedded inside the processing tool 20 and communicate with the processing tool 20 using protocols and interfaces provided by the manufacturer. Alternatively, the process controller 28 may be connected to a larger network of controllers and communicate with the processing tool 20 through an Advanced Process Control (APC) framework interface. For example, the processing tool 20 may be coupled to an equipment interface (not shown) that retrieves various operational data from the processing tool 20 and communicates this data to the Advanced Process Control (APC) framework. Moreover, the equipment interface may receive control signals from the APC framework that may be used to control the processing tool 20.

The semiconductor wafers 24 are generally processed in batches, which are commonly referred to as lots or batch processing. For example, a lot of wafers 24 may be comprised of twenty-five wafers. The wafers 24 within a lot progress through the manufacturing process together in an attempt to subject the wafers 24 to substantially the same manufacturing conditions, such that the resulting semiconductor devices have substantially the same performance characteristics (e.g., speed, power, etc.).

Figure 2:
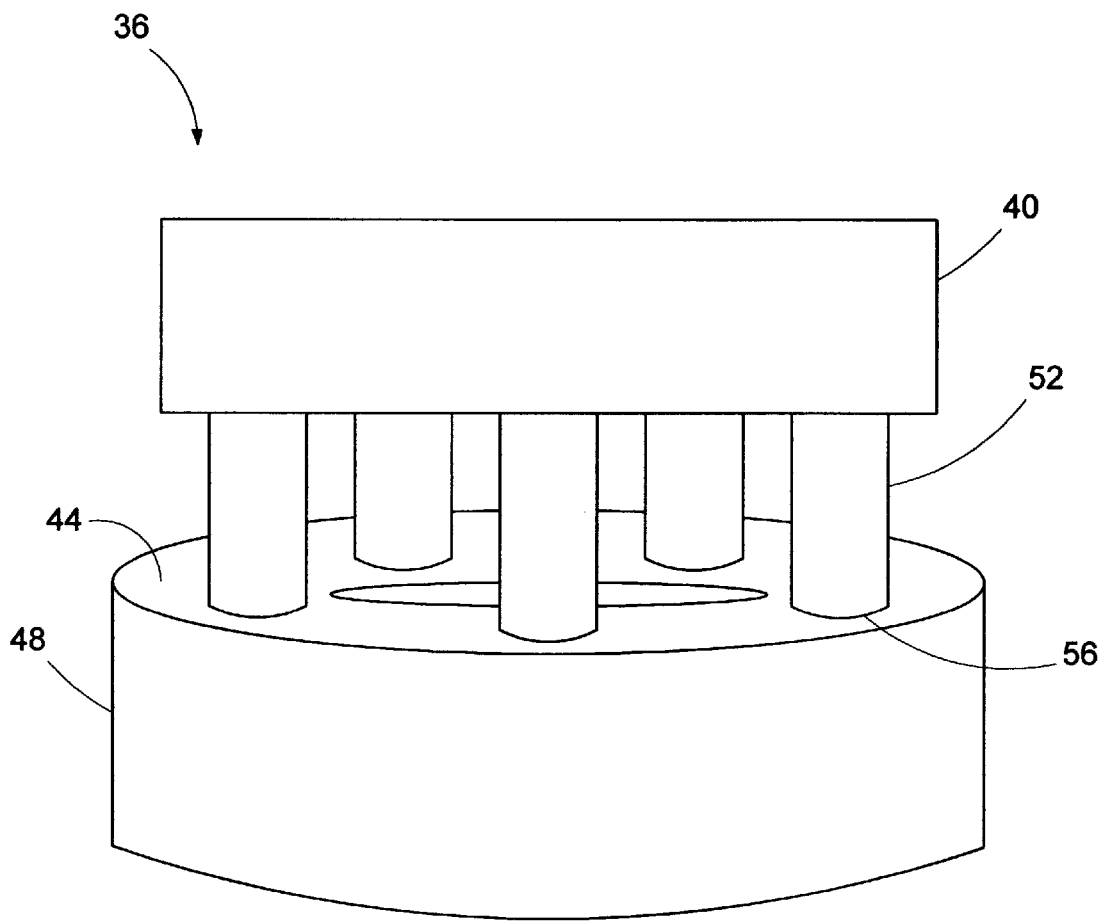
FIG. 2 illustrates a conventional polishing tool having multiple arms.

Referring to FIG. 2, an exemplary multiple arm polishing tool 36 is shown. The exemplary polishing tool 36 may be comprised of a multi-head carrier 40 positioned above a polishing pad 44 that is mounted on a rotateable platen 48. The multi-head carrier 40 typically includes a plurality of rotateable polishing arms 52, each of which includes a carrier head 56. Wafers (not shown) may be secured to the carrier heads 56 using known techniques, such as vacuum pressure. A source of polishing fluid (not shown) may be provided to supply polishing fluid (e.g., slurry) to the polishing pad 44. Furthermore, although five polishing arms 52 are shown, the polishing tool 36 may be comprised of any number of polishing arms 52. For example, in one embodiment, the polishing tool 36 is comprised of only a single polishing arm 52, and each wafer is polished individually.

Figure 3:
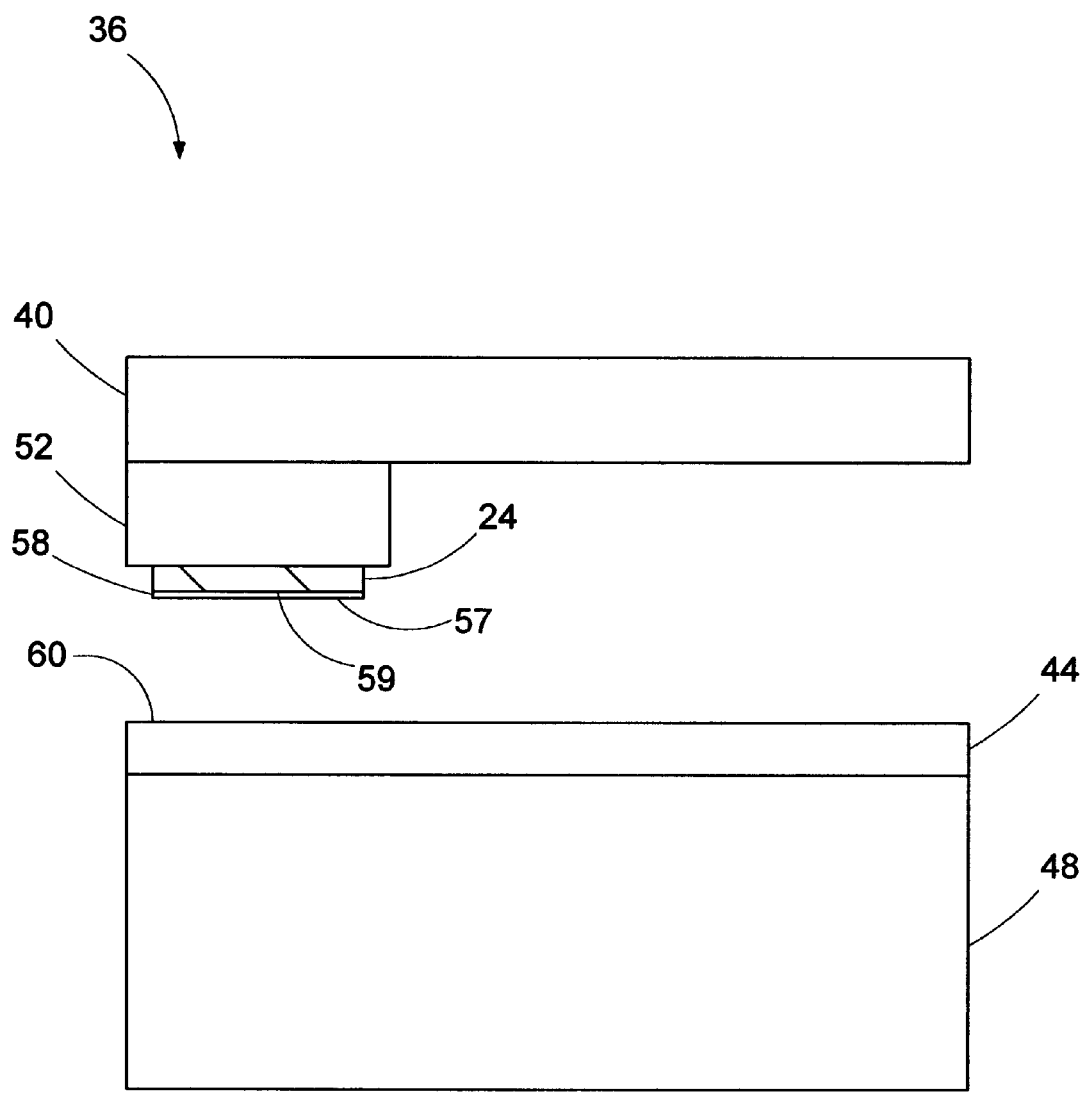
FIG. 3 is a simplified side-view of the polishing tool illustrated in FIG. 2.

Referring to FIG. 3, a simplified side-view of the illustrative polishing tool 36 is shown. To simplify understanding the operation of the polishing tool 36, only one polishing arm 52 is illustrated. Again, the polishing pad 44 may be fixed to the rotatable platen 48. A wafer 24 is connected to the rotatable polishing arm 52, using for example vacuum pressure, and the polishing arm 52 may be connected to the carrier 40. To effectuate polishing, the polishing arm 52 may be extended such that a polishing surface 57 of a process layer 58 formed above a surface 59 of the wafer 24 is pressed against a polishing surface 60 of the polishing pad 44. Furthermore, the platen 48 may be rotated, typically at a constant speed. Moreover, a variable downward force may be applied to the polishing arm 52, and the polishing arm 52 may be rotated and oscillated back and forth across the polishing pad 44.

For ease of illustration, the present invention is described with reference to polishing the process layer 58. However, the present invention should not be construed as being limited to polishing a single process layer 58 formed above a surface 59 of a wafer 24. For example, in a second embodiment, if no process layers 58 are present, the surface 59 of the wafer 24 may be polished in a similar manner as described above. Moreover, in another embodiment, depending upon the process, many process layers 58 may be formed above the surface 59 of the wafer 24, and any exposed portions of the process layers may be polished.

Figure 4:
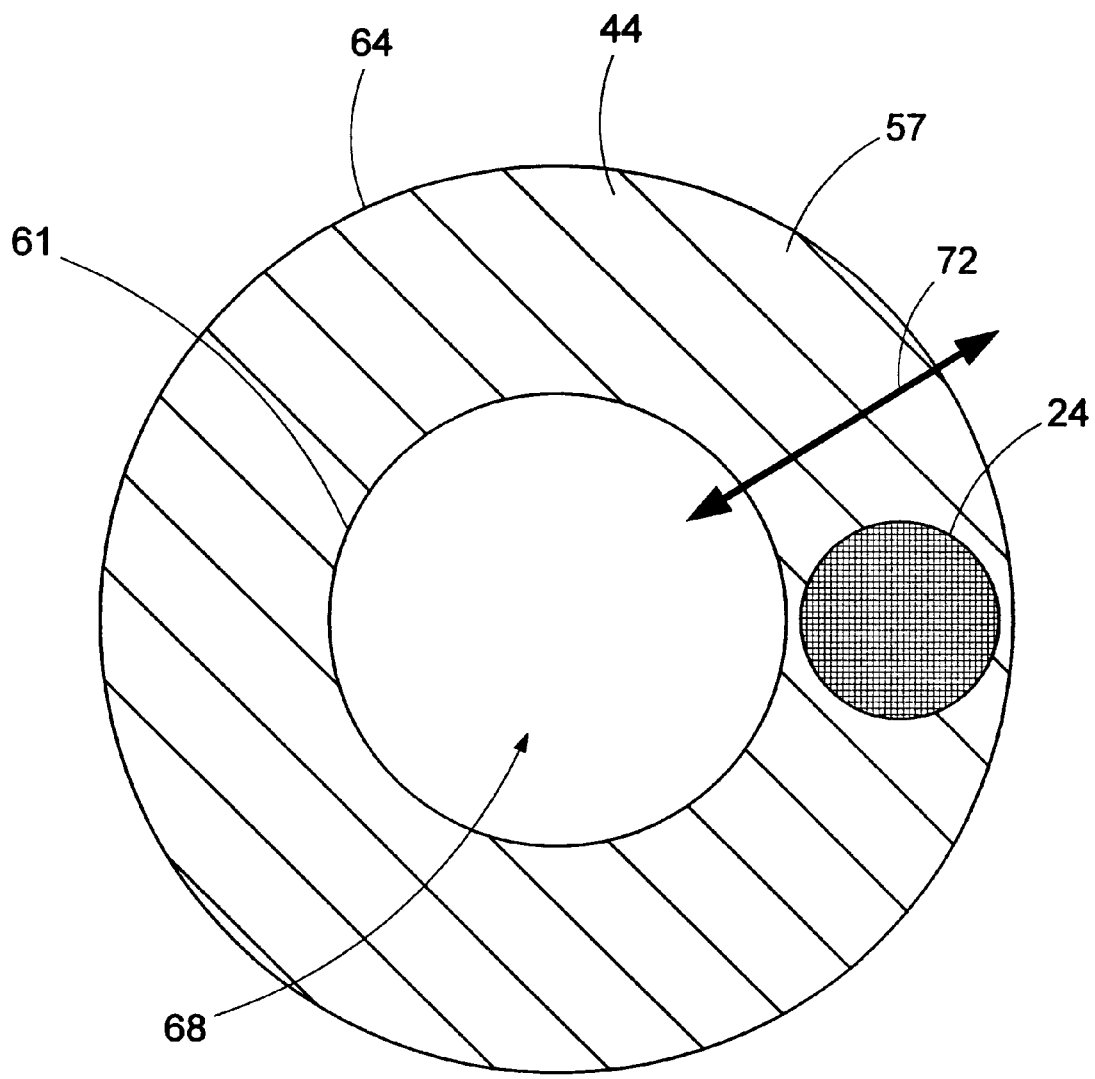
FIG. 4 is a simplified top-view of the polishing tool, shown in FIG. 2.

Referring to FIG. 4, a top-view of the polishing pad 44, illustrated in FIGS. 2 and 3, is shown. The polishing pad 44 may include an inner edge 61, an outer edge 64, and have an opening 68 positioned therein. Moreover, the wafer 24 is shown positioned against the polishing pad 44 between the inner and outer edge 61, 64. For simplicity, the polishing arms 52 and other elements of the polishing tool 36 are not shown. In addition, those skilled in the art will appreciate that a plurality of wafers 24 may be polished at the same time, and that FIG. 4 is a simplified view of the polishing pad 44.

During the polishing process, the wafer 24 may oscillate back and forth across the polishing pad 44. The direction of the oscillation is indicated by arrow 72. Normally, the oscillation length may be adjusted such that a portion of the wafer 24 moves slightly off the inner edge 61 of the polishing pad 44 at the minimum point of oscillation and slightly off the outer edge 64 of the polishing pad 44 at the maximum point of oscillation. Moreover, the oscillation length may be adjusted, and by increasing or decreasing the portion of the wafer 24 that moves off of the polishing pad 44 at the minimum and maximum points of oscillation, the center-to-edge polish rate may be adjusted.

Typically, during a polishing process, slurry is dispersed onto the polishing surface 57 of the polishing pad 44. Once the slurry is deposited onto the polishing pad 44, the chemical and mechanical properties of the slurry may be used to abrade a polishing surface 57 of a process layer 58 formed above the wafer 24 (illustrated in FIG. 3,) For example, depending upon the polishing process, the interaction between the process layer 58, the polishing pad 44, and the abrasive particles within the slurry may be used to mechanically abrade at least a portion of the polishing surface 57 of the process layer 58 formed on the wafer 24.

As the wafers 24 are polished, the slurry may be gradually recaptured, filtered and, re-circulated back into the polishing process as part of a slurry re-circulation loop (not shown). The slurry re-circulation loop may be used to maintain a desired abrasive particle size within the slurry. For example, by filtering the slurry, large groupings of abrasive particles that have become "clumped" together may be removed from the slurry. If not removed, these large agglomerations of particles may scratch or otherwise damage the polishing surface 57 of the process layer 58. Moreover, through filtration, a desired abrasive particle size within a slurry may be sustained. For example, depending upon the process, the abrasive particle size for a slurry may be reduced by using a more restrictive filter (not shown.) In one embodiment, a filter having a 1 μm throughput may be used for producing a slurry having an abrasive particle size of approximately 1 μm or less. Likewise, a 0.5 μm filter may be used to reduce the abrasive particle size within the same slurry to approximately 0.5 μm or less. Those skilled in the art will appreciate that a variety of know filters and techniques may be used to filter the slurry. For example, the slurry may be filtered using bag filters, cartridge filters, and the like.

Generally, all things being equal, the polish removal rate of a polishing process may vary directly with the abrasive particle size within a slurry. For example, the larger the abrasive particles within a slurry the faster the polish removal rate, and similarly, the smaller the abrasive particles within a slurry the slower the polish removal rate. Typically, increasing the abrasive particle size within a slurry increases the probability of surface damage (e.g., microscratches) to the post-polish surface of the process layer 58 on the wafer 24. Likewise, decreasing the abrasive particle size within a slurry may decrease the probability of surface damage to the post-polish surface of the process layer 58 on the wafer 24. Unfortunately, because of the decrease in polish removal rate and the corresponding decrease in wafer throughput, using smaller abrasive particles during an entire polishing process may be cost prohibitive. However, as will be described below, by varying the slurry abrasive particle size during a polishing process, the post-polish surface damage to a process layer 58 may be minimized while not substantially increasing the duration of the polishing process.

Figure 5:
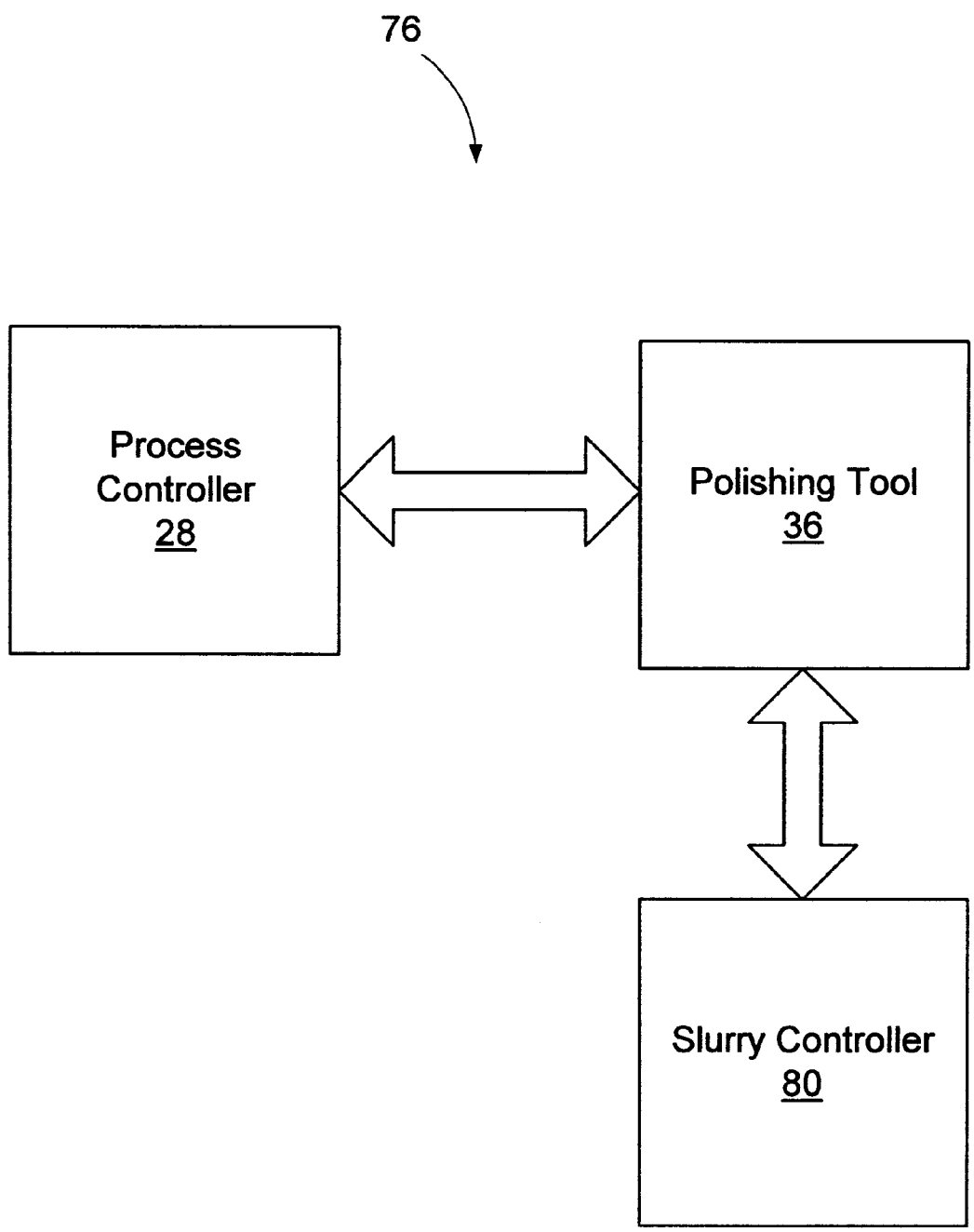
FIG. 5 is an exemplary control system for the polishing tool, shown in FIG. 2.

Referring to FIG. 5, an exemplary control system 76 for the polishing tool 36 is shown. Generally, a variety of control systems may be used with the present invention. Furthermore, because any number control systems may be implemented, the exemplary control system 76 described herein should not be considered as a limitation of the present invention.

In this illustrative embodiment, the control system 76 may be comprised of the process controller 28, the polishing tool 36, and a slurry controller 80. The process controller 28 may be coupled to the polishing tool 36, which may be capable of communicating with the slurry controller 80. Alternatively, in other embodiments, the process controller 28 may communicate directly with the slurry controller 80 or any other device that may be controlling various processing characteristics of the slurry. Furthermore, the process controller 28 may be used to implement the appropriate processing parameters for a particular polishing process. For example, the process controller 28 may determine the duration of the polishing process, the angular velocity of the polishing pad 44, the down force of the polishing arms 52, and, as will be described below, varying the slurry particle size for a polishing process.

In this illustrative embodiment, the slurry controller 80 may be used to monitor and control various processing characteristics of the slurry. For example, the slurry may be comprised of different abrasive fluids, such as silica or alumina abrasive particles, suspended in either a basic or an acidic solution. Depending upon the desired characteristics of the polishing process, the slurry controller 80 may be used to determine the appropriate slurry composition, temperature, flow rate, particle size, and the like.

Although the slurry controller 80 is illustrated as a separate device, the functionality of the slurry controller 80 may be implemented within one of the other components of the control system 76. For example, the functionality of the slurry controller 80 may be included within the polishing tool 36 and/or the process controller 28. With this illustrative embodiment, the process controller 28 may monitor and control the processing characteristics of the slurry. Alternatively, as described above, the control system 76 may be provided by the manufacture of the polishing tool 36, and the processing characteristics of the polishing tool 36 (e.g., slurry particle size) may be adjusted for a particular polishing process In one embodiment, the control system 76 may be implemented using a programmable computer (not shown.) For example, the programmable computer may include a personal computer, a workstation, a network server, a mainframe computer, or the like. The computer may communicate with the polishing tool 36 using a variety of know bus systems, and operate under any suitable operating systems, such as Windows®, MS-DOS, OS/2, UNIX, or the like. Furthermore, the computer may be programmed to execute an application software package whose instructions may be encoded on a computer-readable program storage device, such as a floppy disk. Moreover, the instructions may be included on the hard disk of the computer or other storage medium. More particularly, the computer may be programmed to implement the process of FIG. 6.

Figure 6:
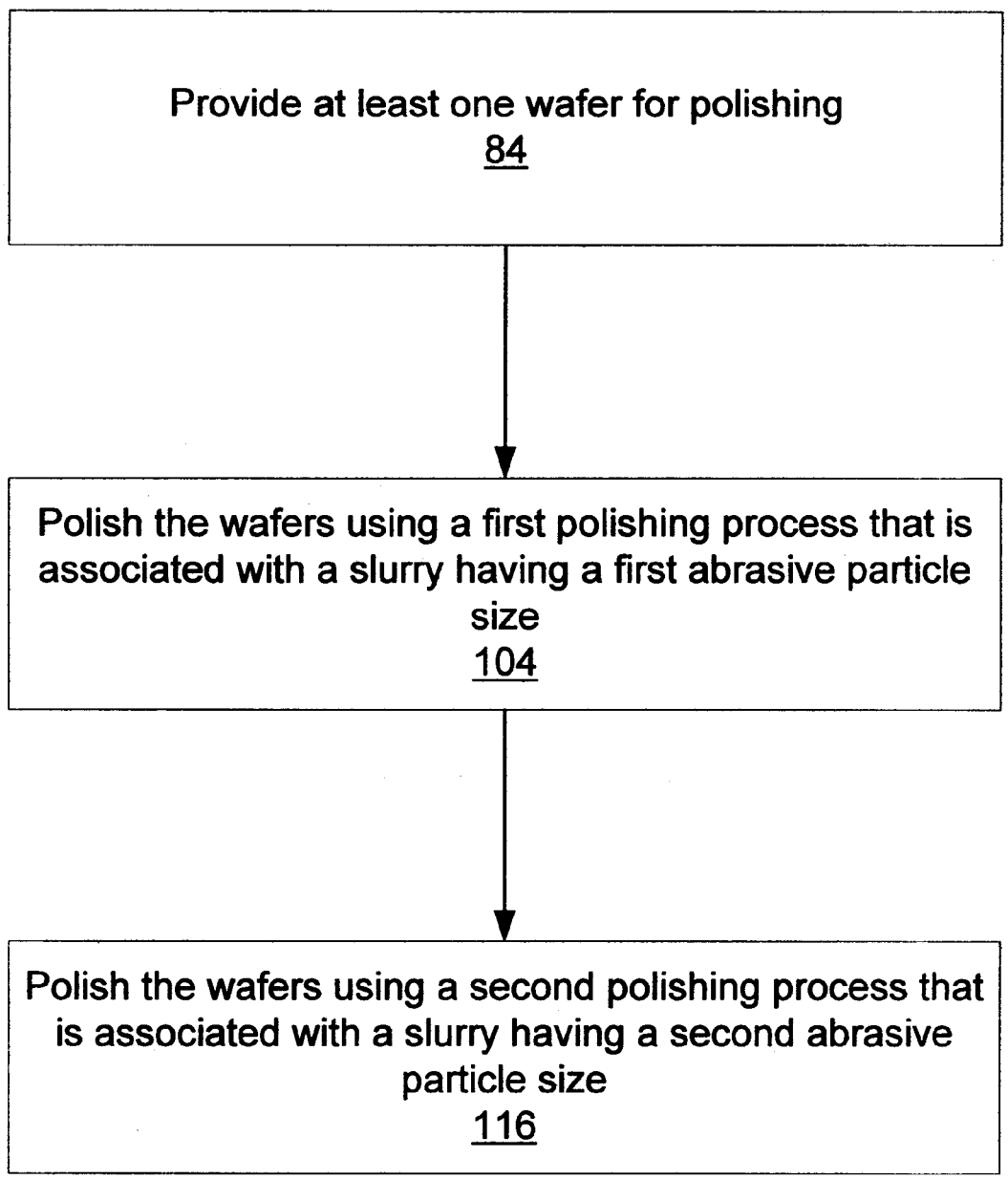
FIG. 6 is a simplified block diagram illustrating one exemplary process for the polishing tool illustrated in FIG. 2 in accordance with one aspect of the present invention.

Referring to FIG. 6, an exemplary process for minimizing surface damage, such as microscratching, to a post-polish surface Of a wafer 24 or process layer 58 is shown. For ease of illustration and not of limitation, the exemplary process will be described with reference to the control system 76, illustrated in FIG. 5. Moreover, as way of simplification and not of limitation, the process will be described with reference to the process layer 58 (illustrated in FIG. 3.)

Figure 7A:
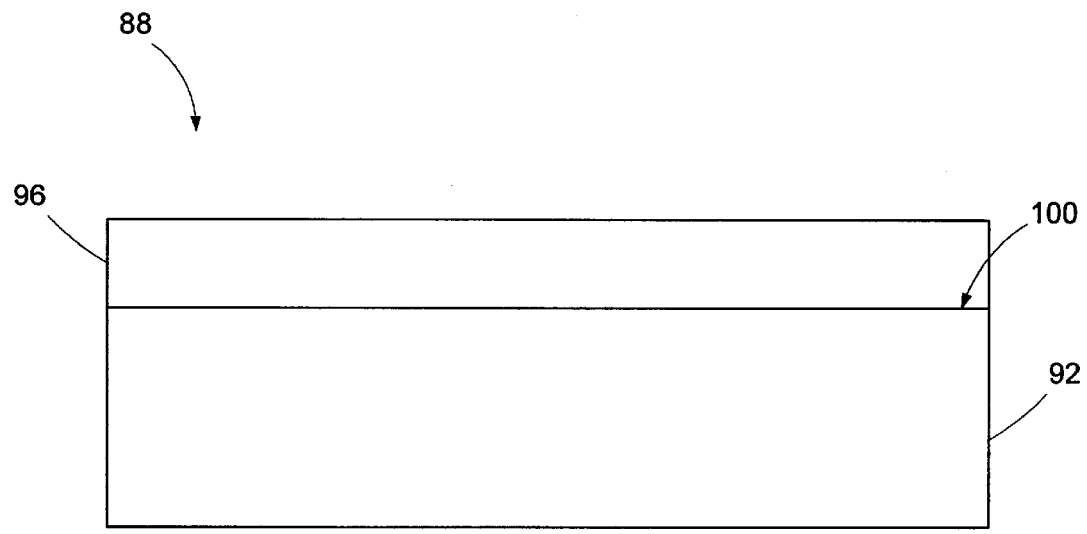
FIGS. 7a–7d are simplified cross-sectional views of a wafer used to illustrate the exemplary process shown in FIG. 6.
Figure 7B:
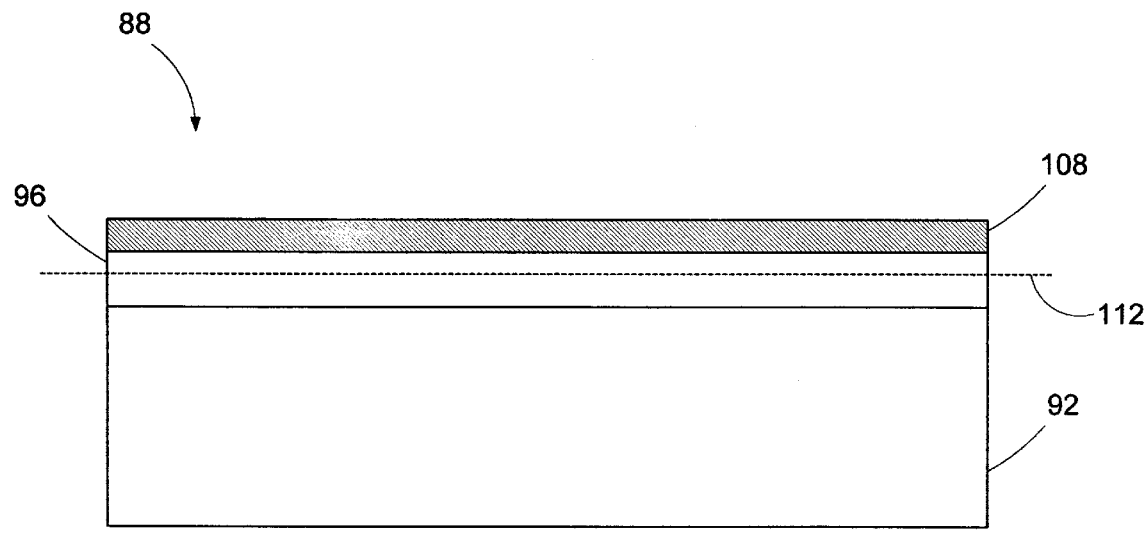
Figure 7C:
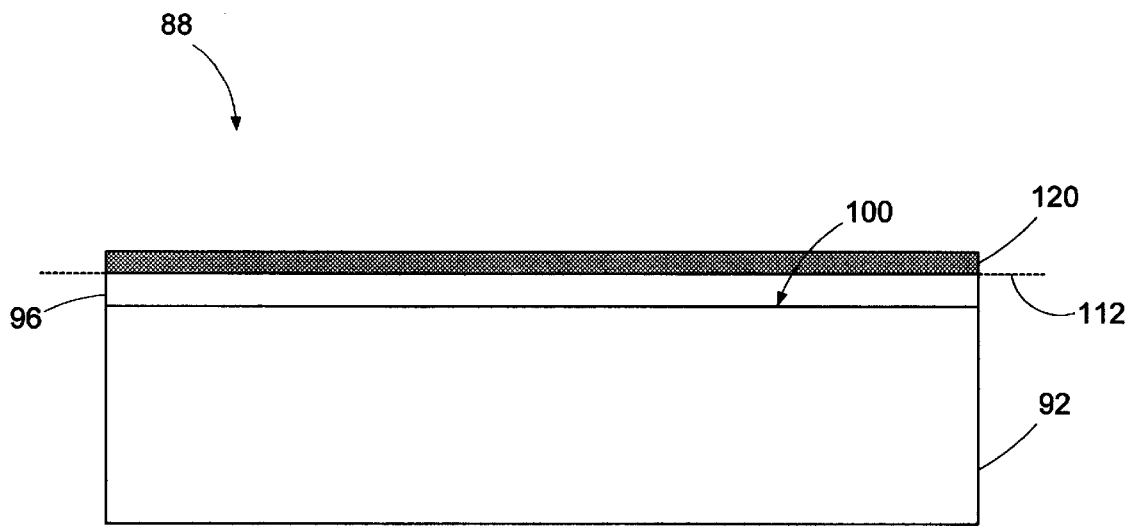
Figure 7D:
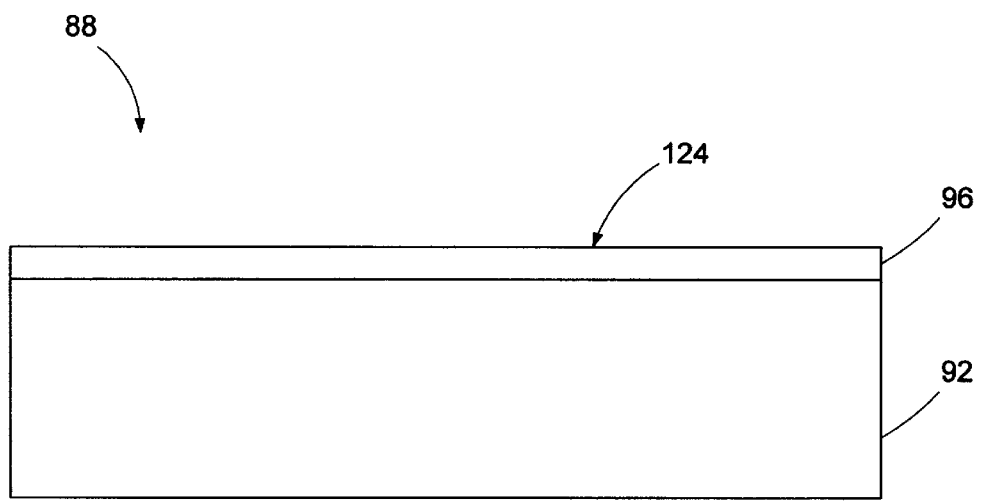

At block 84, at least one wafer 24 having a process layer 58 formed thereon may be provided for polishing. For example, referring to FIG. 7a, an exemplary cross-section of a wafer 88 is shown. It may be appreciated that FIGS. 7a–7d have been simplified to facilitate an understanding of the present invention. In FIG. 7a, the wafer 88 is comprised of a substrate 92 and a process layer 96. Although only one process layer 96 is shown, many process layers 96 may be formed successively above a surface 100 of the wafer 88. Moreover, the process layer 96 may be comprised of a variety of materials, such as metal, polysilicon, and the like. Alternatively, in another embodiment, no process layer 96 may be formed above the substrate 92, and a surface 100 of the wafer 88 may be polished. In this exemplary embodiment, the process layer 96 is comprised of silicon dioxide.

Referring back to block 84, in FIG. 6, depending upon the manufacturing process, a batch of wafers 24 may be provided. For example, the batch may be comprised of twenty-five production wafers. Moreover, these wafers 24 may be part of an elaborate manufacturing process used to process semiconductor wafers 24 into finished semiconductor devices (e.g., memory chips, microprocessors, and the like.) Typically, the polishing of semiconductor wafers 24 may be required many times during the manufacturing process. For example, polishing may be used in conjunction with other semiconductor processes, such as photolithography and deposition, to produce desired circuit configurations on the processing surface of a wafer 24.

In another embodiment, monitor wafers (e.g., test wafers, not shown) may be provided for polishing. Monitor wafers may be very similar to production wafers but have some known useful processing property. For example, a desired process layer, such as silicon dioxide, may be deposited with a precise thickness on a surface of the monitor wafers. With this known characteristic, the monitor wafers may be used for determining optimum processing parameters for a polishing process or any other general testing of the polishing tool 36.

At block 104, the process layer 96 formed above the wafer 88 (shown in FIGS. 7a–7d) may be polished using a first polishing process that is associated with a slurry having a first abrasive particle size. For example, referring to FIG. 7b, a first portion 108 of the process layer 96 may be abraded during the first polishing process. With this illustrative embodiment, the first polishing process may be a more aggressive polish that may be used to quickly remove the first portion 108 of the process layer 96. For example, if it is desired that the process layer 96 be polished down to illustrative line 112, the first polishing process may be used to abrade ⅔–¾ of the required material, which is illustrated by the first portion 108.

Of course, any percentage of the process layer 96 may be removed during the first polishing process, and the percentage of the process layer 96 removed may be selected as a matter of design choice. For example, in another embodiment, the process layer 96 may be completely removed during the first polishing process, and as will be described below, the underlying material (e.g., successive process layer, substrate 92, etc.) may be polished during a second polishing process.

In this illustrative embodiment, the first polishing process is a more aggressive polishing process for rapidly removing the first portion 108 of the process layer 96. Although any abrasive particle size may be used, to increase the polish removal rate, relatively large abrasive slurry particles may be used during the first polishing process. For example, during the first polishing process, the abrasive particle size may range between approximately 0.5–1 $\mu$m. Again, the selected size of the abrasive particles to be used within the slurry may be determined as a matter of design choice. Moreover, the designed for size may be implemented by the control system 76, illustrated in FIG. 5.

Typically, the polishing duration for the first polishing process may vary depending upon various factors, such as slurry particle size, process layer thickness, the material being polished, polishing pad wear, angular velocity of the polishing pad 44, and the like. As described above, typically, increasing the slurry particle size results in increases in the polish removal rate. Although the polishing time may vary, in this illustrative embodiment, the duration of the first polishing process may range between approximately 60–80 seconds.

Referring to FIG. 6, at block 116, the process layer 96 may be polished using a second polishing process that is associated with a slurry having a second abrasive particle size. For example, referring to FIG. 7c, a second portion 120 of the process layer 96 may be abraded during the second polishing process. With this illustrative embodiment, the second polishing process may be a slower, less aggressive polish that may be used to smoothly remove the second portion 120 of the process layer 96, thus, reducing post-polish surface damage to the process layer 96. For example, to remove the remaining portion of the process layer 96, down to illustrative line 112, the second polishing process may be used to abrade ⅓–¼ of the required material, which is illustrated by the second portion 120.

As described for the first polishing process, any percentage of the process layer 96 may be removed during the second polishing process, and the percentage of the process layer 96 removed may be selected as a matter of design choice. For example, in another embodiment, rather than stopping at illustrative line 112, the second polishing process may be used to completely remove the process layer 96. Alternatively, as described above, the first polishing process may be used to completely remove the process layer 96, and once the process layer 96 is removed, the second polishing process may be used to planarize the underlying material (e.g., successive process layer, substrate 92, etc.)

Again, in this illustrative embodiment, the second polishing process is a less aggressive polishing process for reducing surface damage, such as microscratching, to the post-polish surface of the process layer 96. Although any abrasive particle size may be used, to prevent surface damage, relatively small abrasive slurry particles may be used during the second polishing process. For example, during the second polishing process, the abrasive particle size may range between approximately 0.2–0.3 $\mu$m. Again, the selected size of the abrasive particles to be used within the slurry may be determined as a matter of design choice.

As described above, the designed for slurry particle size may be implemented by the control system 76, illustrated in FIG. 5. For example, in this illustrative embodiment, once the first polishing process is complete, a more restrictive filter may be used to reduce the abrasive particle size within the same slurry for the second polishing process. Alternatively, to increase the particle size within a slurry, a less restrictive filter may be used, and the larger desired particle size may be introduced into the slurry. Of course, the slurry re-circulation loop may also be used to replace a first slurry having a certain particle size with a second slurry having a different particle size as well as any other method for controlling the abrasive particle size within a slurry.

In another embodiment, multiple slurry re-circulation loops may be used with the polishing tool 36, along with the slurry controller 80, to manipulate the abrasive particle size during an overall polishing process. With this embodiment, each slurry re-circulation loop may be comprised of a slurry having a different abrasive particle size, and the slurry controller 80, depending upon a requested abrasive particle size for a particular portion of the overall polishing process, may select the appropriate slurry re-circulation loop. For example, if a slurry having an abrasive particle size of 0.5 μm is requested, the slurry controller 80 may select the slurry re-circulation loop that is associated with a slurry having this characteristic. Moreover, if a slurry having a different abrasive particle size is subsequently requested, the slurry controller 80 may simply switch to the appropriate slurry re-circulation loop. Of course, if a slurry switch is made, small traces of the previous slurry may be mixed with subsequently switched to slurry. However, this should not substantially affect the polishing properties of the switched to slurry. Additionally, each slurry re-circulation loop may capture, filter, and re-circulate its associated slurry independently of the other slurry re-circulation loops.

With the exemplary polishing process described above, a first slurry re-circulation loop may be used to sustain the abrasive particle size during the first polishing process, and a second slurry re-circulation loop may be used to sustain the abrasive particle size during the second polishing process. For example, the first slurry re-circulation loop may be comprised of a first slurry having an abrasive particle size of approximately 0.5–1 μm, and the second slurry re-circulation loop may be comprised of a second slurry having an abrasive particle size of approximately 0.2–0.3 μm. Moreover, the first and second slurry re-circulation loops may be equipped with filters that maintain the desired abrasive particle sizes.

Furthermore, the process controller 28 may implement a polishing recipe that selects the first slurry re-circulation loop for the first polishing process and the second slurry re-circulation loop for the second polishing process. For example, once the first polishing process is complete, the first slurry re-circulation loop may capture the first slurry, and the slurry controller 80 may then switch to the second re-circulation loop for the second polishing process. Of course, if the overall polishing process is comprised of more than two different abrasive particle sizes, additional slurry re-circulation loops may be used.

As for the duration of the first polishing process, the duration of the second polishing process may vary depending upon many of the same factors discussed above (e.g., slurry particle size, process layer thickness, etc.) As described above, typically, decreasing the slurry particle size results in a decrease in the polish removal rate. Moreover, although the polishing time may vary, in this illustrative embodiment, the duration of the second polishing process may range between approximately 20–30 seconds.

Although only two exemplary polishing processes are described herein, generally, any number of successive polishing processes may be used with the present invention. Moreover, these successive polishing processes may be associated with various abrasive particle sizes. Generally, any number of polishing processes and any slurry particle size may be used to practice the present invention. For example, in another exemplary embodiment, five polishing processes may be used to remove the first and second portions 108, 120 of the process layer 96 (shown in FIGS. 7b and 7c.) With this additional example, the abrasive particle size within the slurry may be incrementally reduced during each successive polishing process.

In addition to slurry particle size, damage to the post-polish surface of the process layer 96 may be reduced by judicial selection of the abrasive particle composition. Generally, approximately matching the composition of the abrasive particles within a slurry with the composition of the material being polished may reduce the damage to the post-polish surface of the process layer 96. For example, silica abrasive particles may be used for polishing silicon dioxide and alumina abrasive particles may be used for polishing process layers comprised of tungsten.

Although not required to practice the present invention, once the polishing is complete, on a secondary platen (not shown), the process layer 96 may be buffed to remove any residual surface damage not removed during the second polishing process. For example, referring to FIG. 7d, a post-polish surface 124 of the process layer 96 may be pressed against a buffing wheel (not shown) that has been attached to the secondary platen. The rotation of the buffing wheel may be used to alleviate very fine imperfections in the post-polish surface 124 of the process layer 96. By using both the additional polishing processes described herein and the buffing process, a relatively imperfection free processing surface may be obtained.

Alternatively, in another embodiment, rather than using the secondary platen for buffing, the throughput of the polishing process may be increased by using the secondary platen for polishing. For example, in one embodiment, by securing an additional polishing pad 44 to the secondary platen, which is usually reserved for buffing, the throughput of an existing polishing tool 36 may be doubled.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
providing at least one wafer having a process layer formed thereon for polishing;
polishing the process layer using a first polishing process that is associated with a slurry having a first abrasive particle size;
polishing the process layer using a second polishing process that is associated with a slurry having a second abrasive particle size, the second abrasive particle size being less than the first abrasive particle size;
filtering the slurry during the first polishing process through a first filter;
filtering the slurry from the first polishing process through a second filter, the second filter being more restrictive than the first filter; and
re-circulating the slurry from the second filter back to the second polishing process.

2. The method of claim 1, further comprising:
processing the slurry from the first polishing process through a slurry re-circulation loop;
replacing the slurry from the first polishing process with a second slurry that is associated with the second abrasive particle size; and
circulating the second slurry to the second polishing process.

3. The method of claim 2, further comprising:
capturing at least a portion of the slurry from the first polishing process using a first slurry re-circulation loop; and
switching to a second slurry re-circulation loop for the second polishing process, the second slurry re-circulation loop being comprised of the second slurry.

4. The method of claim 1, wherein polishing the process layer using a first polishing process comprises polishing the process layer with a slurry having an abrasive particle size that ranges between approximately 0.5 to 1 $\mu$m.

5. The method of claim 1, wherein polishing the process layer using a second polishing process comprises polishing the process layer with a slurry having an abrasive particle size that ranges between approximately 0.2 to 0.3 m.

6. The method of claim 1, further comprising buffing a post-polish surface of the process layer.

7. The method of claim 1, wherein polishing the process layer using a second polishing process comprises polishing the process layer with a slurry having an abrasive particle composition that approximately matches a composition of a material being polished.

8. A method, comprising:
providing at least one wafer for polishing;
polishing a processing surface of the at least one wafer using a first polishing process that is associated with a slurry having a first abrasive particle size;
polishing the processing surface of the at least one wafer using a second polishing process that is associated with a slurry having a second abrasive particle size, the second abrasive particle size being less than the first abrasive particle size;
filtering the slurry during the first polishing process through a first filter;
filtering the slurry from the first polishing process through a second filter, the second filter being more restrictive than the first filter; and
re-circulating the slurry from the second filter back to the second polishing process.

9. The method of claim 8, wherein polishing the processing layer of the at least one wafer using a first polishing process comprises polishing the processing surface with a slurry having an abrasive particle size that ranges between approximately 0.5 to 1 $\mu$m.

10. The method of claim 8, wherein polishing the processing layer of the at least one wafer using a second polishing process comprises polishing the processing surface with a slurry having an abrasive particle size that ranges between approximately 0.2 to 0.3 $\mu$m.

11. The method of claim 8, further comprising buffing a post-polish surface of the at least one wafer.

12. The method of claim 8, wherein polishing the processing surface of the at least one wafer using a second polishing process comprises polishing the processing surface with a slurry having an abrasive particle composition that approximately matches a composition of a material being polished.

13. A system, comprising:
a polishing tool for polishing wafers, the polishing tool being adapted to:
receive at least one wafer having a process layer formed theron for polishing;
polish the process layer using a first polishing process that is associated with a slurry having a first abrasive particle size; and
polish the process layer using a second polishing process that is associated with a slurry having a second polishing process, the second abrasive particle size being different from the first abrasive particle size; and
a process controller coupled to the polishing tool, the process controller being adapted to communicate with at least one of a slurry controller and the polishing tool.

14. The system of claim 13, further comprising a first filter for controlling the slurry particle size during the first polishing process and a second filter for controlling the slurry particle size during the second polishing process.

15. The system of claim 14, wherein the first filter is associate with a first particle throughput and the second filter is associated with a second particle throughput, the second particle throughput being more restrictive than the first particle throughput.

16. The system of claim 14, wherein the first filter is associate with a first particle throughput and the second filter is associated with a second particle throughput, the second particle throughput being less restrictive than the first particle throughput.

17. The system of claim 13, wherein the polishing tool is adapted to replace the slurry used during the first polishing process with a second slurry used during the second polishing process, the second slurry being associated with the second abrasive particle size.

18. The system of claim 13, further comprising:
a first slurry re-circulation loop for sustaining the abrasive particle size for the slurry used in the first polishing process; and
a second slurry re-circulation loop for sustaining the abrasive particle size for the second slurry used in the second polishing process.

19. The system of claim 13, wherein the first particle size is greater than the second particle size.

20. The system of claim 13, wherein the first particle size is less than the second particle size.

21. The system of claim 13, wherein the polishing tool is adapted to polish the process layer during the second polishing process with a slurry having an abrasive particle composition that approximately matches a composition of a material being polished.

22. The system of claim 13, further comprising a buffing tool adapted to buff a post-polish surface of the process layer.

23. A computer readable program storage device encoded with instructions that, when executed by a computer, performs a method for controlling a polishing tool in a manufacturing process, comprising:
providing at least one wafer having a process layer formed thereon for polishing;
polishing the process layer using a first polishing process that is associated with a slurry having a first abrasive particle size; and
polishing the process layer using a second polishing process that is associated with a slurry having a second abrasive particle size, the second abrasive particle size being different from the first abrasive particle size.

24. The computer readable program storage device encoded with instructions that, when executed by a computer, performs the method described in claim 23, wherein polishing the process layer using a second polishing process further comprises polishing the process layer with a slurry having a second abrasive particle size, the second abrasive particle size being less than the first abrasive particle size.

25. The computer readable program storage device encoded with instructions that, when executed by a computer, performs the method described in claim 24, further comprising:
filtering the slurry during the first polishing process through a first filter;
filtering the slurry from the first polishing process through a second filter, the second filter being more restrictive than the first filter; and
re-circulating the slurry from the second filter back to the second polishing process.

26. The computer readable program storage device encoded with instructions that, when executed by a computer, performs the method described in claim 24, further comprising:
processing the slurry from the first polishing process through a slurry re-circulation loop;
replacing the slurry from the first polishing process with a second slurry that is associated with the second abrasive particle size; and
circulating the second slurry to the second polishing process.

27. The computer readable program storage device encoded with instructions that, when executed by a computer, performs the method described in claim 26, further comprising:
capturing at least a portion of the slurry from the first polishing process using a first slurry re-circulation loop; and
switching to a second slurry re-circulation loop for the second polishing process, the second slurry re-circulation loop being comprised of the second slurry.

28. The computer readable program storage device encoded with instructions that, when executed by a computer, performs the method described in claim 23, wherein polishing the process layer using a second polishing process further comprises polishing the process layer with a slurry having a second abrasive particle size, the second abrasive particle size being greater than the first abrasive particle size.

29. The computer readable program storage device encoded with instructions that, when executed by a computer, performs the method described in claim 28, further comprising:
filtering the slurry during the first polishing process through a first filter;
replacing the filter from the first polishing process with a second filter, the second filter being less restrictive than the first filter;
introducing new abrasive particles to the slurry from the first polishing process; and
re-circulating the slurry from the second filter back to the second polishing process.

30. The computer readable program storage device encoded with instructions that, when executed by a computer, performs the method described in claim 28, further comprising:
processing the slurry from the first polishing process through a slurry re-circulation loop;
replacing the slurry from the first polishing process with a second slurry that is associated with the second abrasive particle size; and
circulating the second slurry to the second polishing process.

31. The computer readable program storage device encoded with instructions that, when executed by a computer, performs the method described in claim 30, further comprising:
capturing at least a portion of the slurry from the first polishing process using a first slurry re-circulation loop; and
switching to a second slurry re-circulation loop for the second polishing process, the second slurry re-circulation loop being comprised of the second slurry.

32. The computer readable program storage device encoded with instructions that, when executed by a computer, performs the method described in claim 23, wherein polishing the process layer using a second polishing process further comprises polishing the process layer with a slurry having an abrasive particle composition that approximately matches a composition of a material being polished.

33. A system, comprising:
means for receiving at least one wafer having a process layer formed thereon for polishing;
means for polishing the process layer using a first polishing process that is associated with a slurry having a first abrasive particle size; and
means for polishing the process layer using a second polishing process that is associated with a slurry having a second abrasive particle size, the second abrasive particle size being different from the first abrasive particle size.

34. A method, comprising:
providing at least one wafer having a process layer formed thereon for polishing;
polishing the process layer using a first polishing process that is associated with a slurry having a first abrasive particle size;
polishing the process layer using a second polishing process that is associated with a slurry having a second abrasive particle size, the second abrasive particle size being less than the first abrasive particle size;
processing the slurry from the first polishing process through a slurry re-circulation loop;
replacing the slurry from the first polishing process with a second slurry that is associated with the second abrasive particle size; and
circulating the second slurry to the second polishing process.

35. The method of claim 34, further comprising:
filtering the slurry during the first polishing process through a first filter;
filtering the slurry from the first polishing process through a second filter, the second filter being more restrictive than the first filter; and
re-circulating the slurry from the second filter back to the second polishing process.

36. The method of claim 34, further comprising:
capturing at least a portion of the slurry from the first polishing process using a first slurry re-circulation loop; and switching to a second slurry re-circulation loop for the second polishing process, the second slurry re-circulation loop being comprised of the second slurry.

37. The method of claim 34, wherein polishing the process layer using a first polishing process comprises polishing the process layer with a slurry having an abrasive particle size that ranges between approximately 0.5 to 1 μm.

38. The method of claim 34, wherein polishing the process layer using a second polishing process comprises polishing the process layer with a slurry having an abrasive particle size that ranges between approximately 0.2 to 0.3 μm.

39. The method of claim 34, further comprising buffing a post-polish surface of the process layer.

40. The method of claim 34, wherein polishing the process layer using a second polishing process comprises polishing the process layer with a slurry having an abrasive particle composition that approximately matches a composition of a material being polished.

41. A method, comprising:
  providing at least one wafer having a process layer formed thereon for polishing;
  polishing the process layer using a first polishing process that is associated with a slurry having a first abrasive particle size;
  polishing the process layer using a second polishing process that is associated with a slurry having a second abrasive particle size, the second abrasive particle size being greater than the first abrasive particle size;
  filtering the slurry during the first polishing process through a first filter;
  replacing the filter from the first polishing process with a second filter, the second filter being less restrictive than the first filter;
  introducing new abrasive particles to the slurry from the first polishing process; and
  re-circulating the slurry from the second filter back to the second polishing process.

42. The method of claim 41, further comprising:
  processing the slurry from the first polishing process through a slurry re-circulation loop;
  replacing the slurry from the first polishing process with a second slurry that is associated with the second abrasive particle size; and
  circulating the second slurry to the second polishing process.

43. The method of claim 42, further comprising:
  capturing at least a portion of the slurry from the first polishing process using a first slurry re-circulation loop; and
  switching to a second slurry re-circulation loop for the second polishing process, the second slurry re-circulation loop being comprised of the second slurry.

44. The method of claim 41, wherein polishing the process layer using a first polishing process comprises polishing the process layer with a slurry having an abrasive particle size that ranges between approximately 0.5 to 1 μm.

45. The method of claim 41, wherein polishing the process layer using a second polishing process comprises polishing the process layer with a slurry having an abrasive particle size that ranges between approximately 0.2 to 0.3 μm.

46. The method of claim 41, further comprising buffing a post-polish surface of the process layer.

47. The method of claim 41, wherein polishing the process layer using a second polishing process comprises polishing the process layer with a slurry having an abrasive particle composition that approximately matches a composition of a material being polished.

48. A method, comprising:
  providing at least one wafer having a process layer formed thereon for polishing;
  polishing the process layer using a first polishing process that is associated with a slurry having a first abrasive particle size;
  polishing the process layer using a second polishing process that is associated with a slurry having a second abrasive particle size, the second abrasive particle size being greater than the first abrasive particle size;
  processing the slurry from the first polishing process through a slurry re-circulation loop;
  replacing the slurry from the first polishing process with a second slurry that is associated with the second abrasive particle size; and
  circulating the second slurry to the second polishing process.

49. The method of claimed 48, further comprising:
  filtering the slurry during the first polishing process through a first filter;
  replacing the filter from the first polishing process with a second filter, the second filter being less restrictive than the first filter;
  introducing new abrasive particles to the slurry from the first polishing process; and
  re-circulating the slurry from the second filter back to the second polishing process.

50. The method of claim 48, further comprising:
  capturing at least a portion of the slurry from the first polishing process using a first slurry re-circulation loop; and
  switching to a second slurry re-circulation loop for the second polishing process, the second slurry re-circulation loop being comprised of the second slurry.

51. The method of claim 48, wherein polishing the process layer using a first polishing process comprises polishing the process layer with a slurry having an abrasive particle size that ranges between approximately 0.5 to 1 μm.

52. The method of claim 48, wherein polishing the process layer using a second polishing process comprises polishing the process layer with a slurry having an abrasive particle size that ranges between approximately 0.2 to 0.3 μm.

53. The method of claim 48, further comprising buffing a post-polish surface of the process layer.

54. The method of claim 48, wherein polishing the process layer using a second polishing process comprises polishing the process layer with a slurry having an abrasive particle composition that approximately matches a composition of a material being polished.

55. A method, comprising:
  providing at least one wafer for polishing;
  polishing a processing surface of the at least one wafer using a first polishing process that is associated with a slurry having a first abrasive particle size;
  polishing the processing surface of the at least one wafer using a second polishing process that is associated with a slurry having a second abrasive particle size, the second abrasive particle size being greater than the first abrasive particle size;

filtering the slurry during the first polishing process through a first filter;

replacing the filter from the first polishing process with a second filter, the second filter being less restrictive than the first filter;

introducing new abrasive particles to the slurry from the first polishing process; and re-circulating the slurry from the second filter back to the second polishing process.

56. The method of claim 55, wherein polishing the processing layer of the at least one wafer using a first polishing process comprises polishing the processing surface with a slurry having an abrasive particle size that ranges between approximately 0.5 to 1 $\mu$m.

57. The method of claim 55, wherein polishing the processing layer of the at least one wafer using a second polishing process comprises polishing the processing surface with a slurry having an abrasive particle size that ranges between approximately 0.2 to 0.3 $\mu$m.

58. The method of claim 55, further comprising buffing a post-polish surface of the at least one wafer.

59. The method of claim 55, wherein polishing the processing surface of the at least one wafer using a second polishing process comprises polishing the processing surface with a slurry having an abrasive particle composition that approximately matches a composition of a material being polished.

* * * * *